(12) United States Patent
Komai (10) Patent No.: US 8,174,088 B2
(45) Date of Patent: May 8, 2012

(54) SOLID STATE IMAGING DEVICE

(75) Inventor: Atsushi Komai, Tokorozawa (JP)

(73) Assignee: Nikon Corporation, Tokyo (JP)

( * ) Notice: Subject to any disclaimer, the term of this patent is extended or adjusted under 35 U.S.C. 154(b) by 238 days.

(21) Appl. No.: 12/708,945

(22) Filed: Feb. 19, 2010

(65) Prior Publication Data

US 2010/0148296 A1 Jun. 17, 2010

Related U.S. Application Data

(63) Continuation of application No. PCT/JP2008/002809, filed on Oct. 6, 2008.

(30) Foreign Application Priority Data

Oct. 26, 2007 (JP) .................................. 2007-278672

(51) Int. Cl.
*H01L 29/41* (2006.01)

(52) U.S. Cl. . 257/448; 257/532; 257/773; 257/E31.111; 348/231.99; 348/231.3

(58) Field of Classification Search .................. 257/448, 257/532, 773, 774, E31.111, E31.112; 348/231.99, 348/231.3; 438/957
See application file for complete search history.

(56) References Cited

U.S. PATENT DOCUMENTS

| | | | | |
|---|---|---|---|---|
| 3,660,667 A | * | 5/1972 | Weimer | ....................... 250/208.1 |
| 5,286,983 A | * | 2/1994 | Sakamoto et al. | .............. 257/59 |
| 5,382,975 A | | 1/1995 | Sakai et al. | |
| 5,471,515 A | | 11/1995 | Fossum et al. | |
| 5,793,322 A | | 8/1998 | Fossum et al. | |
| 5,814,872 A | * | 9/1998 | Noda et al. | ..................... 257/448 |
| 5,841,126 A | | 11/1998 | Fossum et al. | |
| 5,880,691 A | | 3/1999 | Fossum et al. | |
| 5,886,659 A | | 3/1999 | Pain et al. | |
| 5,887,049 A | | 3/1999 | Fossum | |
| 5,909,026 A | | 6/1999 | Zhou et al. | |

(Continued)

FOREIGN PATENT DOCUMENTS

JP 403211769 A * 9/1991

(Continued)

OTHER PUBLICATIONS

International Preliminary Report on Patentability issued in International Application No. PCT/JP2008/002809 on Jun. 1, 2010 (with translation).

(Continued)

*Primary Examiner* — Allan R Wilson
(74) *Attorney, Agent, or Firm* — Oliff & Berridge, PLC (57) ABSTRACT

Storage capacitors Ctd and Cts are provided alternately side by side sequentially in a row direction. Each of the storage capacitors Ctd and Cts has an electrode layer 21 constituting a signal electrode and an upper side electrode layer 23 and a lower side electrode layer 28 constituting a fixed potential electrode. The signal electrodes of the respective storage capacitors Ctd and Cts are electrically independent of each other. The fixed potential electrodes of the respective storage capacitors Ctd and Cts are electrically connected to each other and connected to the ground etc. Contact holes 26*a* and 26*b* that connect the electrode layers 23 and 28 are provided between the electrode layers 21 of the neighboring storage capacitors Ctd and Cts so as to occupy 52% or more of the opposed area of the second electrode sections of two neighboring storage capacitors.

12 Claims, 10 Drawing Sheets

U.S. PATENT DOCUMENTS

| | | | |
|---|---|---|---|
| 5,929,800 | A | 7/1999 | Zhou et al. |
| 5,949,483 | A | 9/1999 | Fossum et al. |
| 5,952,645 | A | 9/1999 | Wang et al. |
| 5,990,506 | A | 11/1999 | Fossum |
| 6,021,172 | A | 2/2000 | Fossum et al. |
| 6,057,539 | A | 5/2000 | Zhou et al. |
| 6,101,232 | A | 8/2000 | Fossum et al. |
| 6,107,618 | A | 8/2000 | Fossum et al. |
| 6,107,619 | A | 8/2000 | Cunningham et al. |
| 6,115,065 | A | 9/2000 | Yadid-Pecht et al. |
| 6,124,819 | A | 9/2000 | Zhou et al. |
| 6,166,768 | A | 12/2000 | Fossum et al. |
| 6,175,383 | B1 | 1/2001 | Yadid-Pecht et al. |
| 6,191,830 | B1* | 2/2001 | Gogna et al. .................... 349/38 |
| 6,326,230 | B1 | 12/2001 | Pain et al. |
| 6,346,700 | B1 | 2/2002 | Cunningham et al. |
| 6,373,050 | B1 | 4/2002 | Pain et al. |
| 6,380,572 | B1 | 4/2002 | Pain et al. |
| 6,384,413 | B1 | 5/2002 | Pain |
| 6,400,824 | B1 | 6/2002 | Mansoorian et al. |
| 6,403,963 | B1 | 6/2002 | Nikzad et al. |
| 6,456,326 | B2 | 9/2002 | Fossum et al. |
| 6,476,860 | B1 | 11/2002 | Yadid-Pecht et al. |
| 6,486,503 | B1 | 11/2002 | Fossum |
| 6,515,702 | B1 | 2/2003 | Yadid-Pecht et al. |
| 6,519,371 | B1 | 2/2003 | Pain et al. |
| 6,546,148 | B1 | 4/2003 | Yadid-Pecht et al. |
| 6,549,235 | B1 | 4/2003 | Fossum et al. |
| 6,555,842 | B1 | 4/2003 | Fossum et al. |
| 6,570,617 | B2 | 5/2003 | Fossum et al. |
| 6,606,122 | B1 | 8/2003 | Shaw et al. |
| 6,665,013 | B1 | 12/2003 | Fossum et al. |
| 6,721,464 | B2 | 4/2004 | Pain et al. |
| 6,744,068 | B2 | 6/2004 | Fossum et al. |
| 6,770,936 | B2* | 8/2004 | Inoue et al. .................... 257/347 |
| 6,784,949 | B1* | 8/2004 | Nagata et al. .................... 349/39 |
| 6,787,749 | B1 | 9/2004 | Zhou et al. |
| 6,801,258 | B1 | 10/2004 | Pain et al. |
| 6,825,059 | B2 | 11/2004 | Fossum |
| 6,838,301 | B2 | 1/2005 | Zheng et al. |
| 6,839,452 | B1 | 1/2005 | Yang et al. |
| 6,933,488 | B2 | 8/2005 | Pain |
| 6,943,838 | B2* | 9/2005 | Fossum et al. ................ 348/311 |
| 6,944,352 | B1 | 9/2005 | Yadid-Pecht et al. |
| 6,980,230 | B2 | 12/2005 | Yadid-Pecht et al. |
| 7,002,626 | B2 | 2/2006 | Pain et al. |
| 7,019,345 | B2 | 3/2006 | Pain et al. |
| 7,053,929 | B2 | 5/2006 | Yadid-Pecht et al. |
| 7,105,371 | B2 | 9/2006 | Fossum et al. |
| 7,190,398 | B1 | 3/2007 | Yadid-Pecht et al. |
| 7,268,814 | B1 | 9/2007 | Pain et al. |
| 7,369,166 | B2 | 5/2008 | Fossum et al. |
| 2003/0127672 | A1* | 7/2003 | Rahn et al. .................... 257/291 |
| 2004/0085465 | A1 | 5/2004 | Inui et al. |
| 2004/0169991 | A1* | 9/2004 | Nagata et al. ............. 361/301.1 |
| 2005/0224888 | A1* | 10/2005 | Graham et al. ............... 257/368 |

FOREIGN PATENT DOCUMENTS

| | | |
|---|---|---|
| JP | A-4-14256 | 1/1992 |
| JP | A-4-42934 | 2/1992 |
| JP | A-5-316348 | 11/1993 |
| JP | A-2002-151672 | 5/2002 |
| JP | A-2004-153682 | 5/2004 |
| JP | B2-3536517 | 6/2004 |

OTHER PUBLICATIONS

International Search Report for International Application No. PCT/JP2008/002809, issued Dec. 16, 2008.

* cited by examiner

SOLID STATE IMAGING DEVICE

CROSS REFERENCE TO THE RELATED APPLICATIONS

This application is a continuation application of International Application PCT/JP2008/002809, filed Oct. 6, 2008, designating the U.S., and claims the benefit of priority from Japanese Patent Application No. 2007-278672, filed on Oct. 26, 2007, the entire contents of which are incorporate herein by reference.

BACKGROUND

1. Field

The present application relates to a solid state imaging device.

2. Description of the Related Art

A solid state imaging device is roughly classified into a CCD sensor and a MOS type sensor. In general, a CCD sensor is more excellent in that noise is small, however, it has a disadvantage that power consumption is large. On the other hand, a MOS type sensor has an advantage that power consumption is drastically smaller than that of a CCD sensor, however, has a disadvantage that noise is somewhat large.

In a MOS type sensor, it is comparatively easy to incorporate various functional circuits using a MOS transistor and as an example, mention is made of an amplifying type solid state imaging device that has a signal amplifying element in a pixel. In such an amplifying type solid state imaging device, noise is likely to occur, which is referred to as fixed pattern noise (FPN), resulting from variations in the photo-receiving element or amplifying element constituting a pixel.

As a method of correcting the fixed pattern noise, a method is described in Patent Document 1 (Japanese Patent Gazette No. 3536517) and Patent Document 2 (Japanese Unexamined Patent Application Publication No. 2002-151672) described below, in which an output in a dark state (Vdark) and an output in a bright state (Vsig) are both read from each pixel and a difference between them is used as a signal output. Such a solid state imaging device includes a plurality of pixels disposed two-dimensionally and photoelectrically converting an incident light, a vertical signal lines provided to correspond to each column of the plurality of pixels and to which output signals of the pixels of the column corresponding thereto are supplied, and a plurality of storage capacitors in which two storage capacitors are provided to correspond to each of the vertical signal lines, and in which a signal corresponding to a signal of the vertical signal line corresponding thereto is stored and at the same time, the signal being stored is supplied to a predetermined horizontal signal line. Then, the output in the dark state from the pixel is stored in one of the storage capacitors provided to correspond to each of the vertical signal lines and in the other storage capacitor, the output in the bright state from the pixel is stored.

SUMMARY

However, in the conventional solid state imaging device as described above, the coupling capacitance formed between two neighboring storage capacitors of the plurality of storage capacitors is not taken into consideration specially, and the coupling capacitance is comparatively large. Because of this, comparatively large crosstalk occurs between neighboring pixel signals, causing noise in the image signal, and as a result, the image quality of the output image is degraded.

The embodiments of the present application have been developed with the above-mentioned circumstances being taken into consideration, and a proposition thereof is to provide a solid state imaging device, in which the coupling capacitance formed between two neighboring storage capacitors is reduced, crosstalk between neighboring pixel signals is reduced, and thereby, the noise in the image signal is reduced and the image quality of the output image is improved.

In order to solve the above-mentioned problems, a solid state imaging device according to a first embodiment includes a plurality of pixels disposed two-dimensionally and photoelectrically converting incident light, vertical signal lines provided to correspond to each column of the plurality of pixels and to which output signals of the pixels of the column corresponding thereto are supplied, and a plurality of storage capacitors provided in a predetermined number to correspond to each of the vertical signal lines, in which a signal corresponding to a signal of the vertical signal line corresponding thereto is stored and at the same time, the signal being stored is supplied to a predetermined horizontal signal line, in which the plurality of storage capacitors are provided sequentially side by side in a predetermined direction, each of the storage capacitors has a first electrode section and a second electrode section that form a capacitance in between, the first electrode sections of the plurality of storage capacitors are electrically connected with one another, the second electrode sections of the plurality of storage capacitors are electrically independent of one another, and one or more electric conductors electrically connected to the first electrode section are provided between the second electrode sections of two neighboring storage capacitors of the plurality of storage capacitors so as to occupy 52% or more of an opposed area of the second electrode sections of two neighboring storage capacitors.

Here, the wording "so as to occupy 52% or more of the opposed area" means that "so that L2/L1 is 52% or more, where L1 is a length in a direction perpendicular to the predetermined direction of the overlapped part of the orthogonal projection of the two second electrode sections (the second electrode sections of the two neighboring storage capacitors) on a plane perpendicular to the predetermined direction and L2 is the sum of the length(s) (however, the lengths of the overlapped parts of the orthogonal projection of two or more electric conductors are added only once and not added more) in the direction perpendicular to the predetermined direction of the orthogonal projection of the one or more electric conductors on the plane perpendicular to the predetermined direction".

In order to further reduce the coupling capacitance formed between two neighboring storage capacitors, the above-mentioned percentage is preferably 55% or more, and more preferably, 60% or more, 70% or more, 80% or more and 90% or more in this order, and most preferably, 100%.

In a solid state imaging device according to a second embodiment, the one or more electric conductors include electric conductors in a plurality of groups, the electric conductors in the plurality of groups are disposed in a column sequentially at intervals in a direction that intersects the predetermined direction for each group, the columns including the electric conductors of each of the groups sequentially neighbor one another in the predetermined direction, and the position in the intersecting direction of each electric conductor of at least one group of electric conductors of the plurality of groups is shifted with respect to the position in the intersecting direction of each electric conductor of at least another group of electric conductors of the plurality of groups in the first embodiment.

In a solid state imaging device according to a third embodiment, the one or more electric conductors include an electric conductor that continuously extends in a direction that intersects the predetermined direction in the first or second embodiment.

In a solid state imaging device according to a fourth embodiment, the one or more electric conductors include a group of electric conductors disposed in a column sequentially at intervals in a direction that intersects the predetermined direction and an electric conductor that continuously extends in the intersecting direction, and the column of the one group of electric conductors and the electric conductor that continuously extends neighbor each other in the predetermined direction in the first embodiment.

A solid state imaging device according to a fifth embodiment includes a plurality of pixels disposed two-dimensionally and photoelectrically converting an incident light, vertical signal lines provided to correspond to each column of the plurality of pixels and to which output signals of the pixels of the column corresponding thereto are supplied, and a plurality of storage capacitors provided in a predetermined number to correspond to each of the vertical signal lines, in which a signal corresponding to a signal of the vertical signal line corresponding thereto is stored and at the same time, the signal being stored is supplied to a predetermined horizontal signal line, in which the plurality of storage capacitors are provided sequentially side by side in a predetermined direction, each of the storage capacitors has a first electrode section and a second electrode section that form a capacitance in between, the first electrode sections of the plurality of storage capacitors are electrically connected with one another, the second electrode sections of the plurality of storage capacitors are electrically independent of one another, one or more electric conductors electrically connected to the first electrode section are provided between the second electrode sections of two neighboring storage capacitors of the plurality of storage capacitors, the one or more electric conductors include electric conductors in a plurality of groups, the electric conductors in the plurality of groups are disposed in a column sequentially at intervals in a direction that intersects the predetermined direction for each group, the columns including the electric conductors of each of the groups sequentially neighbor one another in the predetermined direction, and the position in the intersecting direction of each electric conductor of at least one group of electric conductors of the plurality of groups is shifted with respect to the position in the intersecting direction of each electric conductor of at least another group of electric conductors of the plurality of groups.

A solid state imaging device according to a sixth embodiment includes, a plurality of pixels disposed two-dimensionally and photoelectrically converting an incident light, vertical signal lines provided to correspond to each column of the plurality of pixels and to which output signals of the pixels of the column corresponding thereto are supplied, and a plurality of storage capacitors provided in a predetermined number to correspond to each of the vertical signal lines, in which a signal corresponding to a signal of the vertical signal line corresponding thereto is stored and at the same time, the signal being stored is supplied to a predetermined horizontal signal line, in which the plurality of storage capacitors are provided sequentially side by side in a predetermined direction, each of the storage capacitors has a first electrode section and a second electrode section that form a capacitance in between, the first electrode sections of the plurality of storage capacitors are electrically connected with one another, the second electrode sections of the plurality of storage capacitors are electrically independent of one another, one or more electric conductors electrically connected to the first electrode section are provided between the second electrode sections of two neighboring storage capacitors of the plurality of storage capacitors, the one or more electric conductors include a group of electric conductors disposed in a column sequentially at intervals in a direction that intersects the predetermined direction and an electric conductor that continuously extends in the intersecting direction, and the column of the one group of electric conductors and the electric conductor that continuously extends neighbor each other in the predetermined direction.

In a solid state imaging device according to a seventh embodiment, the plurality of storage capacitors includes a photo signal storage capacitor that stores a photo signal including photo information photoelectrically converted in the pixel and a differential signal storage capacitor that includes a noise component to be subtracted from the photo signal in any of the first to sixth embodiments.

In a solid state imaging device according to an eighth embodiment, the first electrode section has an electrode layer, the second electrode section has an upper side electrode layer and a lower side electrode layer disposed in a hierarchy on the upper side and the lower side with respect to the electrode layer of the first electrode section, and the one or more electric conductors are formed in a contact hole to connect the upper side electrode layer and the lower side electrode layer in any of the first to seventh embodiments.

According to the present embodiments, it is possible to provide a solid state imaging device, in which the coupling capacitance formed between two storage capacitors neighboring each other is reduced and crosstalk between neighboring pixel signals is reduced, and thereby, the noise in the image signal is reduced and the quality of the output image is improved.

DETAILED DESCRIPTION OF THE EMBODIMENTS

A solid state imaging device is explained below with reference to the drawings.

First Embodiment

Figure 1:
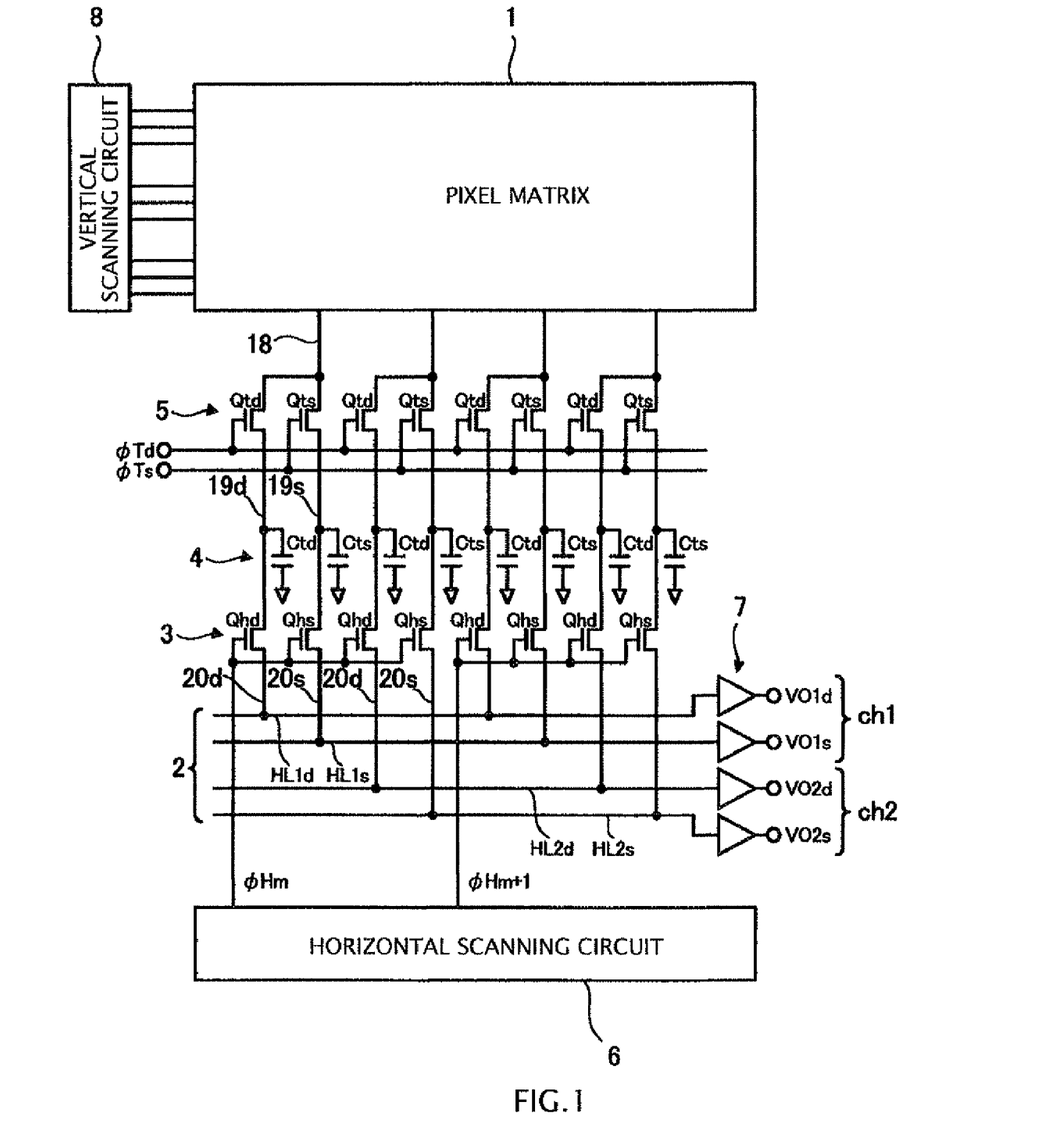
FIG. 1 is a circuit diagram showing a general configuration of a solid state imaging device according to a first embodiment.
Figure 2:
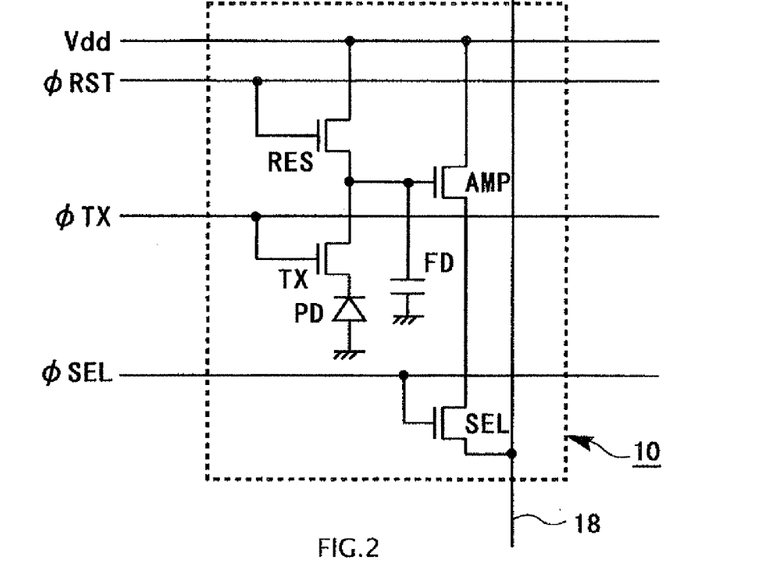
FIG. 2 is a circuit diagram showing a unit pixel that constitutes a pixel matrix in FIG. 1.

FIG. 1 is a circuit diagram showing a general configuration of a solid state imaging device according to a first embodiment. FIG. 2 is a circuit diagram showing a unit pixel 10 that constitutes a pixel matrix 1 in FIG. 1.

The solid state imaging device according to the present embodiment is configured as an amplifying type solid state imaging device and as shown in FIG. 1, includes the pixel matrix 1 configured by arranging the unit pixels 10 in the direction of row and the direction of column, a horizontal reading line (horizontal signal line) 2 including, for example, four lines in total, a horizontal reading switch group 3, a storage capacitor group 4, a signal transfer switch group 5, a horizontal scanning circuit 6, an output amplifier group 7 and a vertical scanning circuit 8.

Similar to a general CMOS type solid state imaging device, each pixel 10 has, as shown in FIG. 2, a photodiode PD as a photoelectric conversion section that generates and stores signal charges corresponding to incident light, a floating diffusion FD as a charge/voltage conversion section that receives the signal charge and converts the signal charge into a voltage, an amplifying transistor AMP as an amplifying section that outputs a signal corresponding to a potential of the floating diffusion FD, a transfer transistor TX as a charge transferring section that transfers the charge from the photodiode PD to the floating diffusion FD, a reset transistor RES as a resetting section that resets the potential of the floating diffusion FD and a select transistor SEL as a selecting section that selects the pixel 10. In the present embodiment, all of the transistors AMP, TX, RES and SEL of the pixel 10 are nMOS transistors. In FIG. 2, Vdd denotes a power source voltage.

The gate of the transfer transistor TX is connected to a control line that supplies a control signal φTX to the transfer transistor TX, which controls the transfer transistor TX, from the vertical scanning circuit 8 for each row. The gate of the reset transistor RES is connected to a control line that supplies a control signal φRST to the reset transistor RES, which controls the reset transistor RES, from the vertical scanning circuit 8 for each row. The gate of the select transistor SEL is connected to a control line that supplies a control signal φSEL to the select transistor SEL, which controls the select transistor SEL, from the vertical scanning circuit 8 for each row.

The photodiode PD generates signal charges to correspond to the amount of incident light. The transfer transistor TX turns on during the high-level period of time of the transfer pulse (control signal) φTX and transfers the signal charges stored in the photodiode PD to the floating diffusion FD. The reset transistor RES turns on during the high-level period of time of the reset pulse (control signal) φRST and resets the floating diffusion FD.

The drain of the amplifying transistor AMP is connected to the power source voltage Vdd, the gate thereof is connected to the floating diffusion FD, and the source thereof is connected to the drain of the select transistor SEL, and thus, a source follower circuit with a load of a constant current source (not shown schematically) is configured. The amplifying transistor AMP outputs a reading current to a vertical signal line 18 via the select transistor SEL to correspond to a voltage value of the floating diffusion FD. The select transistor SEL turns on during the high-level period of time of the selection pulse (control signal) φSEL and connects the source of the amplifying transistor AMP to the vertical signal line 18.

The vertical scanning circuit 8 receives a drive pulse (not shown schematically) from outside and outputs the selection pulse φSEL, the reset pulse φRST and the transfer pulse φTX, respectively, for each row of the pixel 10. The horizontal scanning circuit 6 receives a drive pulse (not shown schematically) from outside and outputs a control signal φHm etc.

The horizontal reading line 2 includes, as shown in FIG. 1, a dark signal line HL1$d$ and a bright signal line HL1$s$ of a channel 1 and a dark signal line HL2$d$ and a bright signal line HL2$s$ of a channel 2. The vertical signal line 18 that extends in the longitudinal direction from the pixel matrix 1 and is connected to the pixel 10 in each column is connected to one of electrode sections (hereinafter, referred to as a "signal electrode") of a dark signal storage capacitor Ctd by a wire 19$d$ and to one of electrode sections of a bright signal storage capacitor Cts by a wire 19$s$ via a dark signal transfer switch Qtd and a bright signal transfer switch Qts in each column, respectively. In this manner, the signal electrodes of the storage capacitors Ctd and Cts are electrically independent of each other. The other electrode sections (hereinafter, referred to as a "fixed potential electrode") of these storage capacitors Ctd and Cts are electrically connected to each other and connected to, for example, the ground. The signal electrode of the storage capacitor Ctd is connected to the dark signal line HL1$d$ of the channel 1 or to the dark signal line HL2$d$ of the channel 2 of the horizontal reading line 2 by a wire 20$d$ via a dark signal horizontal switch Qhd. The signal electrode of the storage capacitor Cts is connected to the bright signal line HL1$s$ of the channel 1 or to the bright signal line HL2$s$ of the channel 2 of the horizontal reading line 2 by a wire 20$s$ via a bright signal horizontal switch Qhs.

In the solid state imaging device according to the present embodiment having such a structure, first, the dark signal transfer switch Qtd is turned on by a control signal φTd and a dark signal from the pixel 10 in the selected row in the pixel matrix 1 is transferred via each vertical signal line 18 and stored in the dark signal storage capacitor Ctd. After the transfer operation is completed, Qtd is turned off. Following that, the pixel 10 in the selected row of the pixel matrix 1 is brought into a signal output state and at the same time, the bright signal transfer switch Qts is turned on by a control signal φTs and the signal output from the selected row is transferred via the vertical signal line 18, respectively, and stored in the bright signal storage capacitor Cts. After the transfer operation is completed, Qts is turned off. During the period of these operations, the dark signal horizontal switch Qhd and the bright signal horizontal switch Qhs are kept in the off state.

Next, in the state where the dark signal transfer switch Qtd and the bright signal transfer switch Qts are kept in the off state, a reading control signal, for example, φHm is supplied sequentially from the horizontal scanning circuit 6 and signals corresponding to two channels are read sequentially. That is, for example, by the horizontal reading pulse φHm, the dark signal and bright signal horizontal switches Qhd and Qhs corresponding to two channels are turned on, and the dark signal charge and the bright signal charge from the dark signal storage capacitor Ctd and the bright signal storage capacitor Cts are transferred to the dark signal line HL1d and the bright signal line HL1s or the dark signal line HL2d and the bright signal HL2s of the horizontal reading line 2, respectively. The dark signal and the bright signal of the channel 1 are output from the dark signal line HL1d and the bright signal line HL1s, respectively, via the respective output amplifiers 7 as a dark signal output VO1d and a bright signal output VO1s. Further, the dark signal and the bright signal of the channel 2 are output from the dark signal line HL2d and the bright signal line HL2s, respectively, via the respective output amplifiers 7 as a dark signal output VO2d and a bright signal output VO2s. Because of this, a signal the fixed pattern noise of which has been corrected is obtained by subtracting the dark signal output from the bright signal output in each of the channels 1 and 2. That is, in the channel 1, VO1s-VO1d is an output signal and in the channel 2, VO2s-VO2d is an output signal.

As can be seen from the above explanation, in the present embodiment, the bright signal storage capacitor Cts of the storage capacitor group (a plurality of storage capacitors) 4 stores the photo signal that includes photo information converted photoelectrically in a pixel 20 as a signal corresponding to the signal of the corresponding vertical signal line 18 and the dark signal storage capacitor Ctd stores the differential signal that includes the noise component to be subtracted from the photo signal, that is, a so-called dark signal, as a signal corresponding to the signal of the corresponding vertical signal line 18.

Figure 3:
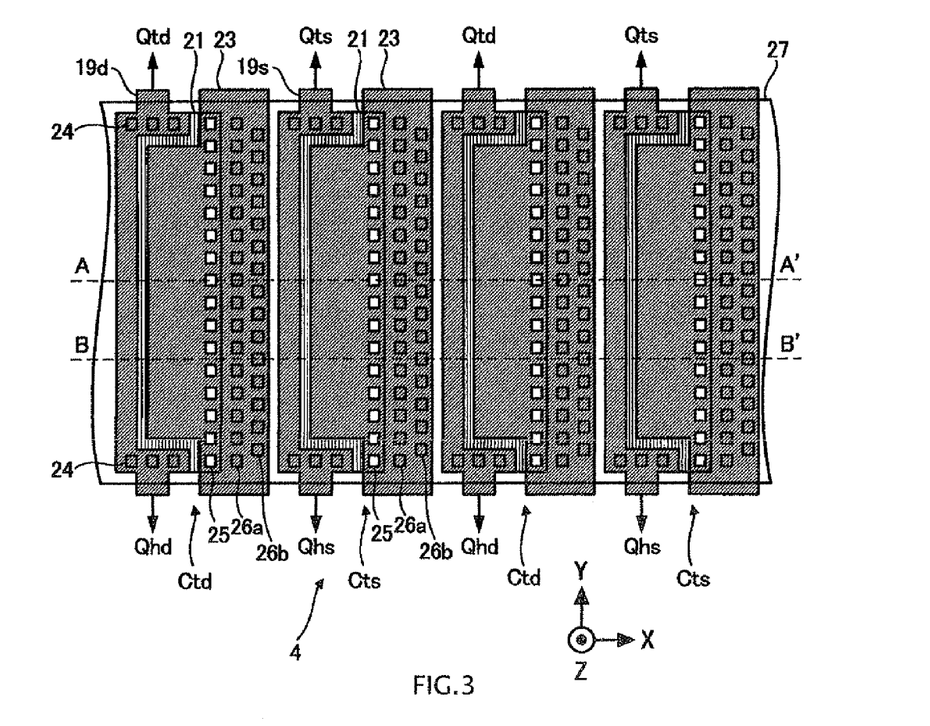
FIG. 3 is a schematic plan view showing part of a structure of a group of storage capacitors of the solid state imaging device according to the first embodiment.
Figure 4:
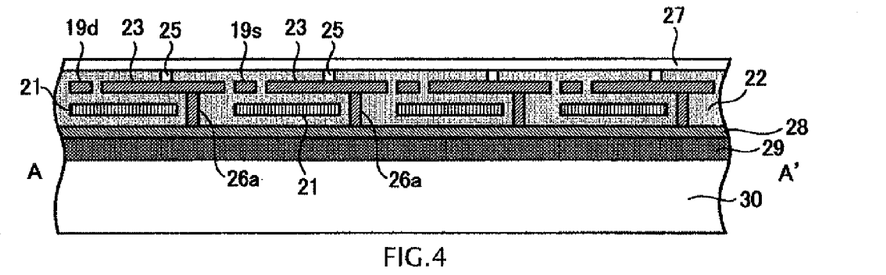
FIG. 4 is a schematic section view along A-A' line in FIG. 3.
Figure 5:
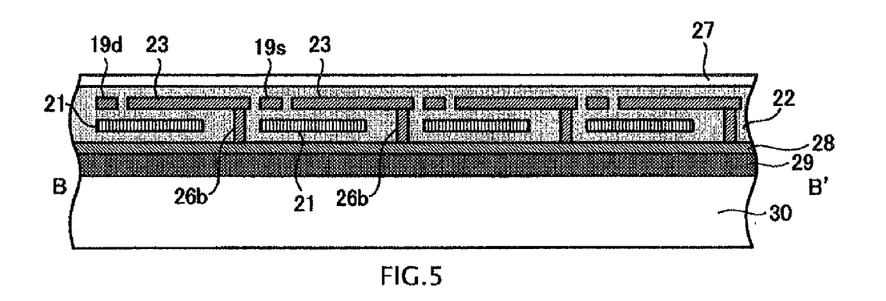
FIG. 5 is a schematic section view along B-B' line in FIG. 3.
Figure 6:
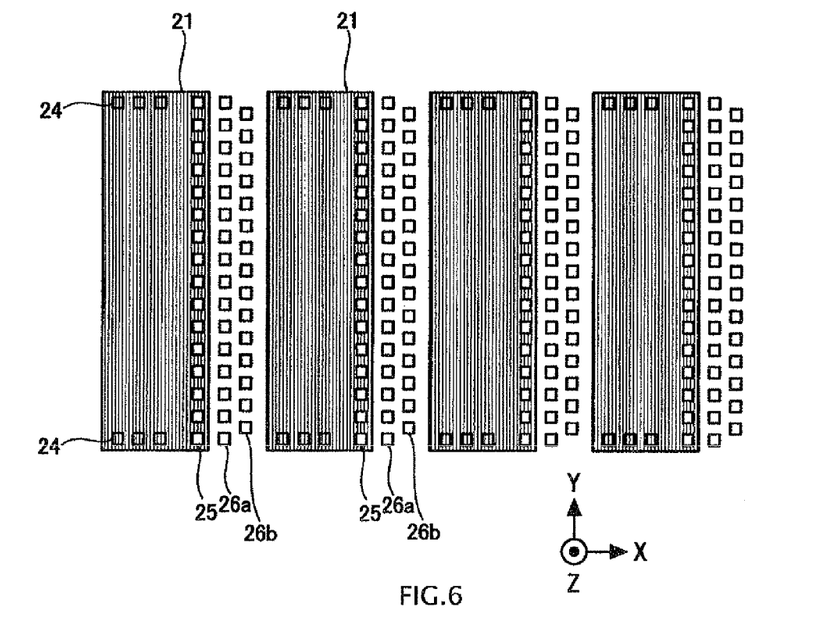
FIG. 6 is a schematic plan view showing an electrode layer including a polysilicon layer in FIG. 3 to FIG. 5.
Figure 7:
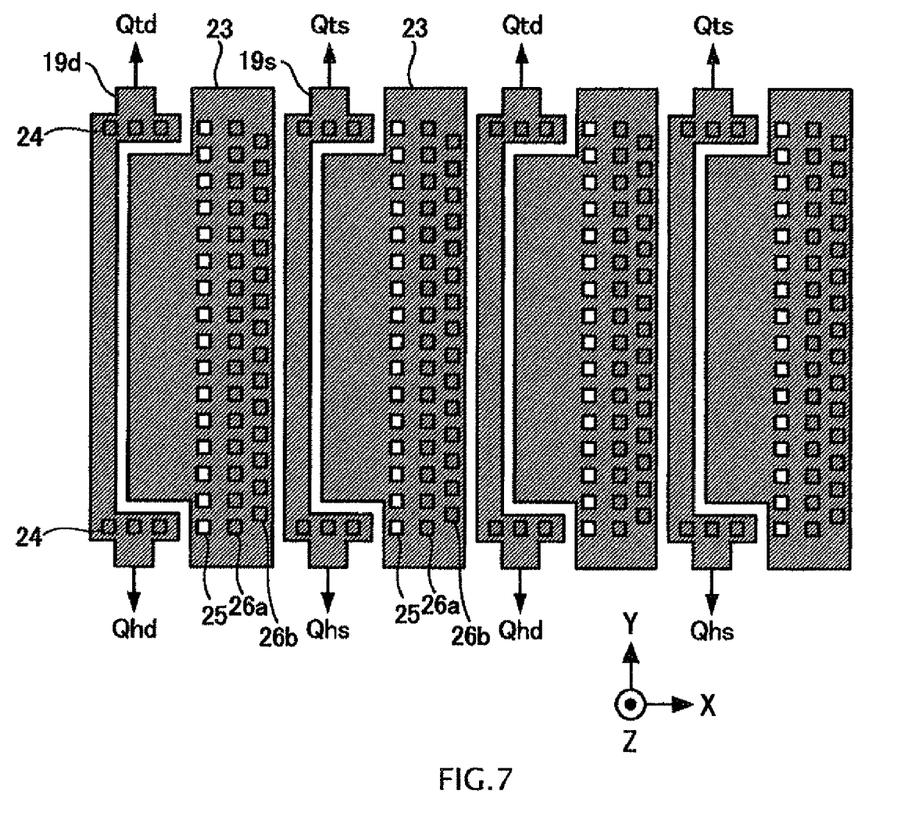
FIG. 7 is a schematic plan view showing an electrode layer and a wire layer including a first aluminum wire layer in FIG. 3 to FIG. 5.

FIG. 3 is a schematic plan view showing part of a structure of the storage capacitor group 4 of the solid state imaging device according to the present embodiment. FIG. 4 is a schematic section view along A-A' line in FIG. 3. FIG. 5 is a schematic section view along B-B' line in FIG. 3. FIG. 6 is a schematic plan view showing an electrode layer 21 including a polysilicon (polycrystalline silicon) layer in FIG. 3 to FIG. 5. FIG. 7 is a schematic plan view showing an electrode layer 23 and the wire layers 19d and 19s including a first aluminum wire layer in FIG. 3 to FIG. 5. In FIG. 6 and FIG. 7, contact holes 24, 25, 26a and 26b are also shown. Further, as shown in FIG. 3, X axis, Y axis and Z axis perpendicular to one another are defined (also in other figures). The direction of the X axis is the direction of row (horizontal direction) and the direction of the Y axis is the direction of column (vertical direction).

In the present embodiment, each of the storage capacitors Cts and Cts of the storage capacitor group 4 is arranged sequentially side by side in the direction of the X axis so that the dark signal storage capacitor Ctd and the bright signal storage capacitor Cts are arranged alternately side by side. The dark signal storage capacitor Ctd and the bright signal storage capacitor Cts have the same structure and shape.

In FIG. 4 and FIG. 5, reference numeral 30 denotes an N-type silicon substrate, 29 a P-type well, 28 an electrode layer including an N-type diffusion layer and 22 an insulating layer, such as s silicon oxide film. The electrode layer 21 including a polysilicon layer constitutes a signal electrode of each of the storage capacitors Ctd and Cts. The wires 19d and 19s are formed in the first aluminum wire layer and connected to the electrode layer (signal electrode) 21 of each of the storage capacitors Ctd and Cts via the contact hole 24 (to be precise, aluminum that is the electric conductor formed in the contact hole 24). In FIG. 3, the wire 19d is connected to the dark signal transfer switch Qtd in a +Y direction and connected to the dark signal horizontal switch Qhd in a −Y direction. The wire 19s is connected to the bright signal transfer switch Qts in the +Y direction and connected to the bright signal horizontal switch Qhs in the −Y direction.

The upper side electrode layer (part of the fixed potential electrode) 23 formed for each of the storage capacitors Ctd and Cts in the first aluminum wire layer is connected to the lower side electrode layer (another part of the fixed potential electrode) 28 including an N-type diffusion layer formed continuously with respect to each of the storage capacitors Ctd and Cts via the contact holes 26a and 26b (to be precise, aluminum that is the electric conductor formed in the contact holes 26a and 26b). The upper side electrode layer 23 is formed in the upper side hierarchy with respect to the electrode layer (signal electrode) 21 of each of the storage capacitors Ctd and Cts and the lower side electrode layer 28 is formed in the lower side hierarchy with respect to the electrode layer (signal electrode) 21 of each of the storage capacitors Ctd and Cts. The upper side electrode layer (part of the fixed potential electrode) 23 is connected to an electrode layer (still another part of the fixed potential electrode) 27 formed in the still upper side hierarchy continuously with respect to each of the storage capacitors Ctd and Cts in a second aluminum wire layer via the contact hole 25 (to be precise, aluminum that is the electric conductor formed in the contact hole 25).

The fixed potential electrode of each of the storage capacitors Ctd and Cts is configured by the electrode layers 23, 28 and 27 and the contact holes 25, 26a and 26b. In general, the fixed potential electrode is connected to the ground. Each of the storage capacitors Ctd and Cts is configured between the fixed potential electrode and the electrode layer 21, which is a signal electrode, as a capacitance formed via the insulating layer 22. The plurality of the contact holes 25 is arranged side by side in a column in the direction of the Y axis as shown in FIG. 3, FIG. 6 and FIG. 7.

The contact holes 26a and 26b are located between the electrode layers (signal electrode) 21 of the storage capacitors Ctd and Cts neighboring each other. In the present embodiment, the contact holes 26a and 26b are provided between the electrode layers (signal electrode) 21 of the storage capacitors Ctd and Cts neighboring each other so as to occupy 52% or more of the opposed area. Here, the wording "so as to occupy 52% or more of the opposed area" means that "so that L2/L1 is 52% or more, where L1 is a length in a direction (direction of the Y axis) perpendicular to the direction (direction of the X axis) in which the storage capacitors Ctd and Cts are arranged side by side of the overlapped part of the orthogonal projection of the two second electrodes 21 (the second electrodes 21 of two neighboring storage capacitors) on a plane (YZ plane) perpendicular to the direction (direction of the X axis) of the arrangement of the storage capacitors Ctd and Cts, and L2 is the sum of the length(s) (however, the lengths of the overlapped parts of the orthogonal projection of the contact holes 26a and 26b are added only once and not added more) in the direction (direction of the Y axis) perpendicular to the direction (direction of the X axis) of the arrangement of the orthogonal projection of the contact holes 26a and 26b on the plane (YZ plane) perpendicular to the direction of the arrangement (direction of the X axis)". In order to further reduce the coupling capacitance formed between the two storage capacitors Ctd and Cts neighboring each other, preferably, the percentage is 55% or more, or more preferably in the ascending order of 60% or more, 70% or more, 80% or more and 90% or more, and 100% is the most preferable percentage.

In the present embodiment, specifically, the plurality of the contact holes 26a is arranged side by side in a column in the direction of the Y axis, the plurality of the contact holes 26b is arranged side by side in a column in the direction of the Y axis, the column of the contact hole 26a and the column of the contact hole 26b neighbor each other in the direction of the X axis, and the position of each contact hole 26a in the direction of the Y axis and the position of each contact hole 26b in the direction of the Y axis are shifted from each other. In a specific example, the contact holes 26a and 26b each have a square shape in a planar view the size of one side of which is L, the plurality of the contact holes 26a and 26b is arranged in a column sequentially at intervals of L in the direction of the Y axis, and the position of the contact hole 26a in the direction of the Y axis and the position of each contact hole 26b in the direction of the Y axis are shifted by L from each other. Due to this, the above-mentioned percentage is almost 100%. However, the arrangement of the contact holes between the electrode layers (signal electrode) 21 is not limited to such an example, and the number of columns of the contact hole and the amount of the positional shift in the direction of the Y axis for each column may be set appropriately.

In the present embodiment, in the section along A-A' line in FIG. 3, as shown in FIG. 4, the contact hole 26a to which a fixed potential, such as the ground, is applied is interposed between the neighboring electrode layers (signal electrode) 21. Because of this, in the section along A-A' line in FIG. 3, no coupling capacitance is formed between the neighboring electrode layers (signal electrode) 21 due to the electrostatic shielding effect of the contact hole 26a. Particularly, in the present embodiment, in the section along A-A' line in FIG. 3, the electrode layer (signal electrode) 21 is completely shielded electrically by the electrode layers 23, 27 and 28 and the contact hole 26a constituting the fixed potential electrode, and therefore, no coupling capacitance is formed between the neighboring electrode layers (signal electrode) 21.

Further, in the present embodiment, in the section along B-B' line in FIG. 3, as shown in FIG. 5, the contact hole 26b to which a fixed potential, such as the ground, is applied is interposed between the neighboring electrode layers (signal electrode) 21. Because of this, in the section along B-B' line in FIG. 3, no coupling capacitance is formed between the neighboring electrode layers (signal electrode) 21 due to the electrostatic shielding effect of the contact hole 26b. Particularly, in the present embodiment, in the section along B-B' line in FIG. 3, the electrode layer (signal electrode) 21 is completely shielded electrically by the electrode layers 23, 27 and 28 and the contact hole 26b constituting the fixed potential electrode, and therefore, no coupling capacitance is formed between the neighboring electrode layers (signal electrode) 21.

Because of the above, according to the present embodiment, the coupling capacitance formed between the two neighboring storage capacitors Ctd and Cts is reduced and crosstalk between the neighboring pixel signals is reduced, and thereby, the noise in the image signal is reduced and the quality of the output image is improved.

Figure 8:
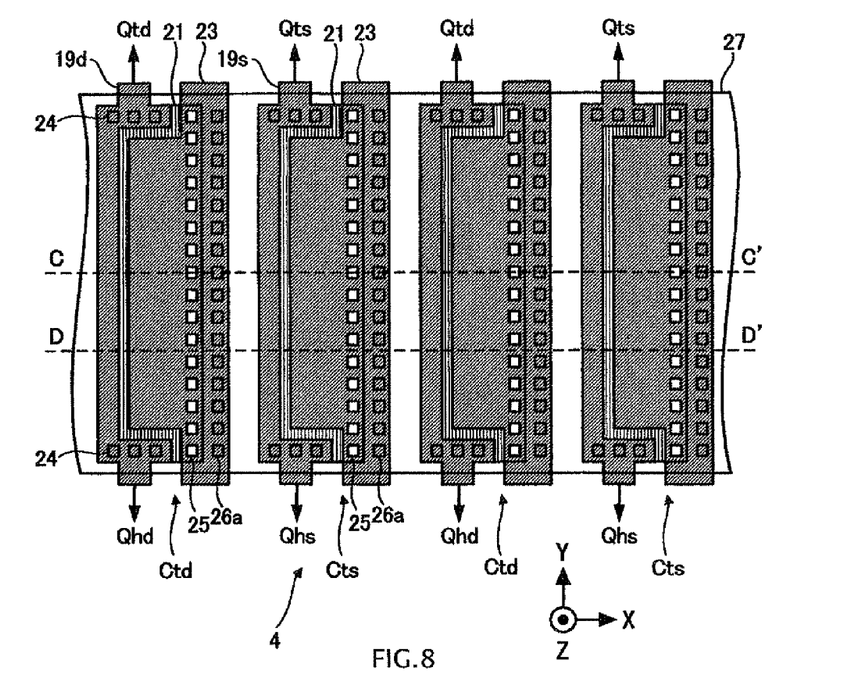
FIG. 8 is schematic plan view showing part of a structure of a group of storage capacitors of a solid state imaging device in a comparative example.
Figure 9:
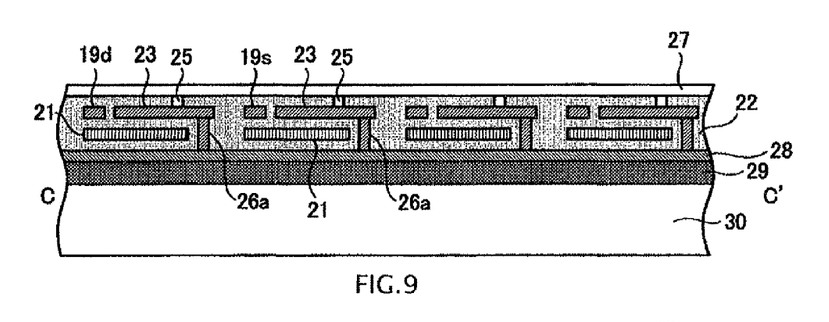
FIG. 9 is a schematic section view along C-C' line in FIG. 8.
Figure 10:
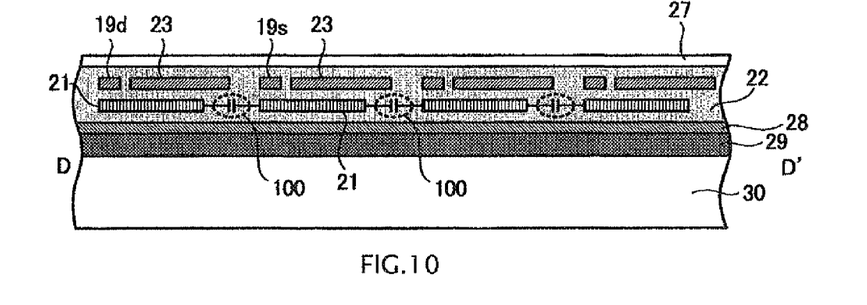
FIG. 10 is a schematic section view along D-D' line in FIG. 8.
Figure 11:
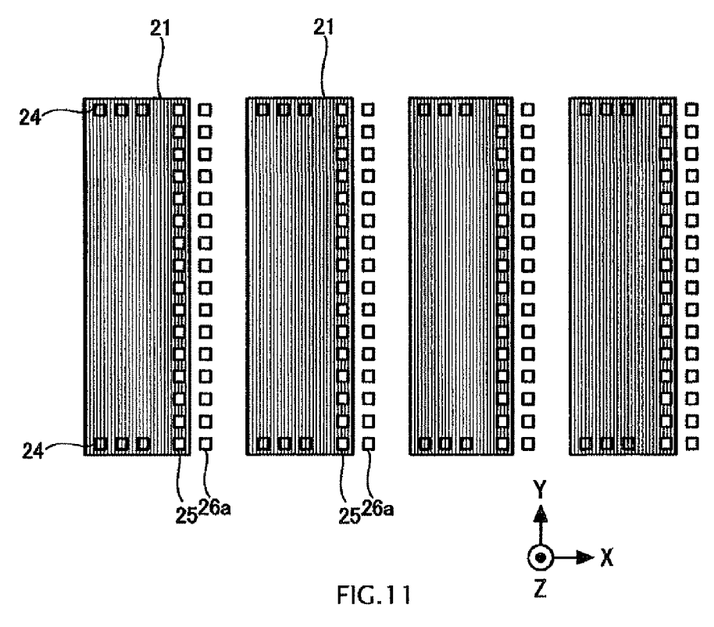
FIG. 11 is a schematic plan view showing an electrode layer including a polysilicon layer in FIG. 8 to FIG. 10.
Figure 12:
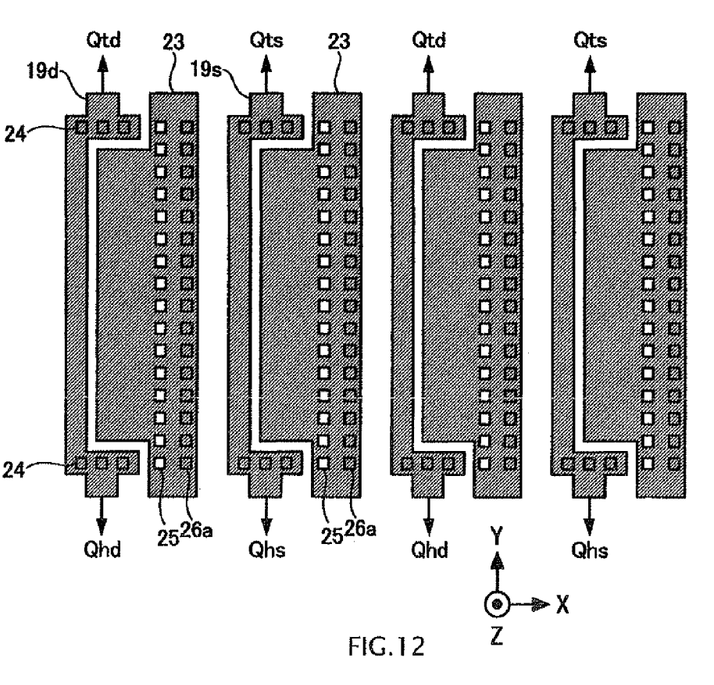
FIG. 12 is a schematic plan view showing an electrode layer and a wire layer including a first aluminum wire layer in FIG. 8 to FIG. 10.

Here, a solid state imaging device in a comparative example, which is compared with the solid state imaging device according to the present embodiment, is explained with reference to FIG. 8 to FIG. 12. FIG. 8 is a schematic plan view showing part of the structure of the storage capacitor group 4 of the solid state imaging device in the comparative example, corresponding to FIG. 3. FIG. 9 is a schematic section view along C-C' line in FIG. 8, corresponding to FIG. 4. FIG. 10 is a schematic section view along D-D' line in FIG. 8, corresponding to FIG. 5. In FIG. 10, a coupling capacitance 100 between the neighboring electrode layers (signal electrode) 21 is shown schematically. FIG. 11 is a schematic plan view showing the electrode layer 21 including the polysilicon layer in FIG. 8 to FIG. 10, corresponding to FIG. 6. FIG. 12 is a schematic plan view showing the electrode layer 23 and the wire layers 19d and 19s including the first aluminum wire layer in FIG. 8 to FIG. 10, corresponding to FIG. 7. In FIG. 11 and FIG. 12, the contact holes 24, 25 and 26a are also shown.

The comparative example differs from the present embodiment only in that the contact hole 26b is removed and between the electrode layers (signal electrode) 21 of the storage capacitors Ctd and Cts neighboring each other, only the contact hole 26a is provided. In the comparative example also, the contact hole 26a has a square shape in a plan view the size of one side of which is L and the plurality of the contact holes 26a is arranged side by side in a column at intervals of L in the direction of the Y axis. Because of this, in the comparative example, the contact hole provided between the electrode layers (signal electrode) 21 of the storage capacitors Ctd and Cts neighboring each other is arranged so as to cover only 50% of the opposed area between the electrode layers (signal electrode) 21.

In the comparative example also, as in the present embodiment, in the section along C-C' line in FIG. 8, as shown in FIG. 9, the contact hole 26a to which a fixed potential, such as the ground, is applied is interposed between the neighboring electrode layers (signal electrode) 21. Because of this, in the section along C-C' line in FIG. 8, no coupling capacitance is formed between the neighboring electrode layers (signal electrode) 21 due to the electrostatic shielding effect of the contact hole 26a.

However, in the comparative example, unlike the present embodiment, in the section along D-D' line in FIG. 8, as shown in FIG. 10, no contact hole is interposed between the neighboring electrode layers (signal electrode) 21. Because of this, in the section along D-D' line in FIG. 8, the coupling capacitance 100 having a comparatively large capacitance is formed between the neighboring electrode layers (signal electrode) 21.

Consequently, according to the comparative example, the coupling capacitance formed between the two storage capacitors Ctd and Cts neighboring each other becomes comparatively large and crosstalk between the neighboring pixel signals becomes comparatively large, and thereby, the noise in the image signal becomes large and the quality of the output image is degraded.

In contrast to this, in the present embodiment, as can be easily understood by comparison between FIG. 5 and FIG. 10, the coupling capacitance 100, which is formed in the comparative example, is not formed, and therefore, compared to the comparative example, crosstalk between the neighboring pixel signals is reduced, and thereby, the noise in the image signal is reduced and the quality of the output image is improved.

Second Embodiment

Figure 13:
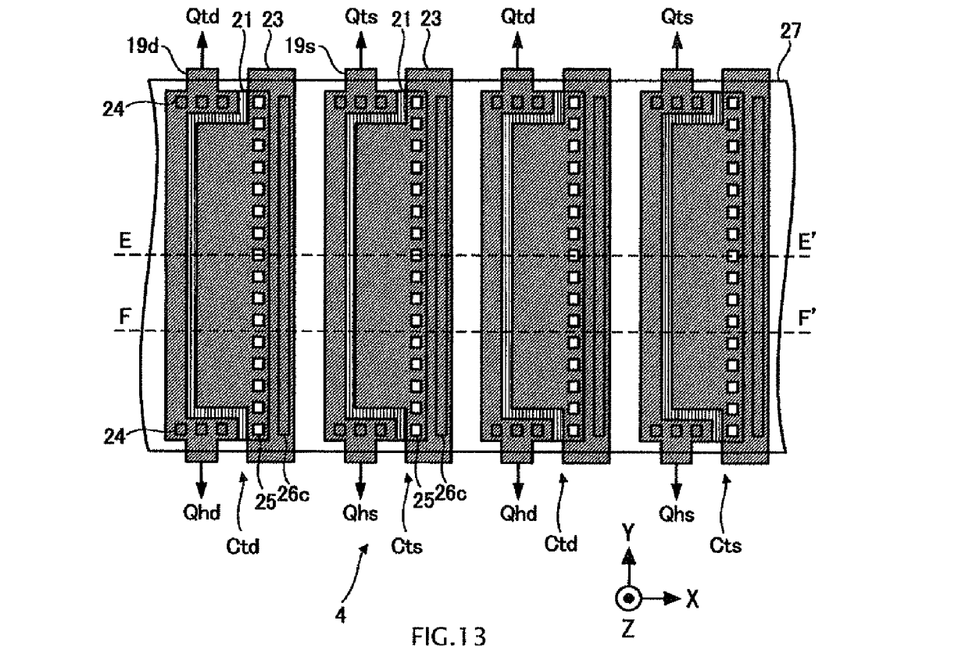
FIG. 13 is a schematic plan view showing part of a structure of a group of storage capacitors of a solid state imaging device according to a second embodiment.
Figure 14:
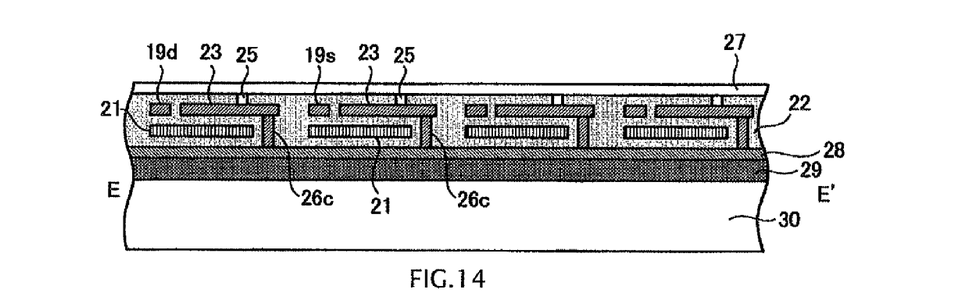
FIG. 14 is a schematic section view along E-E' line in FIG. 13.
Figure 15:
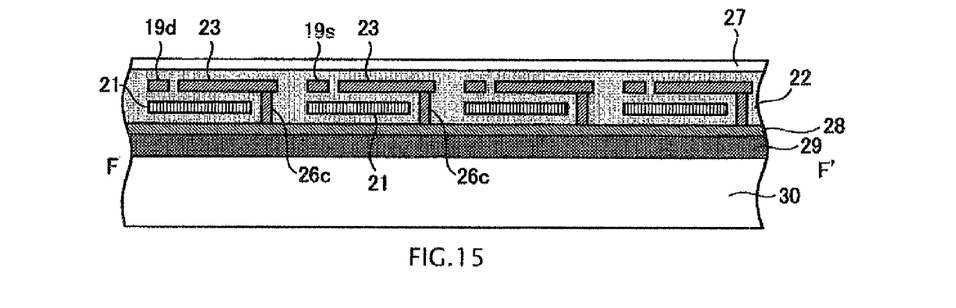
FIG. 15 is a schematic section view along F-F' line in FIG. 13.
Figure 16:
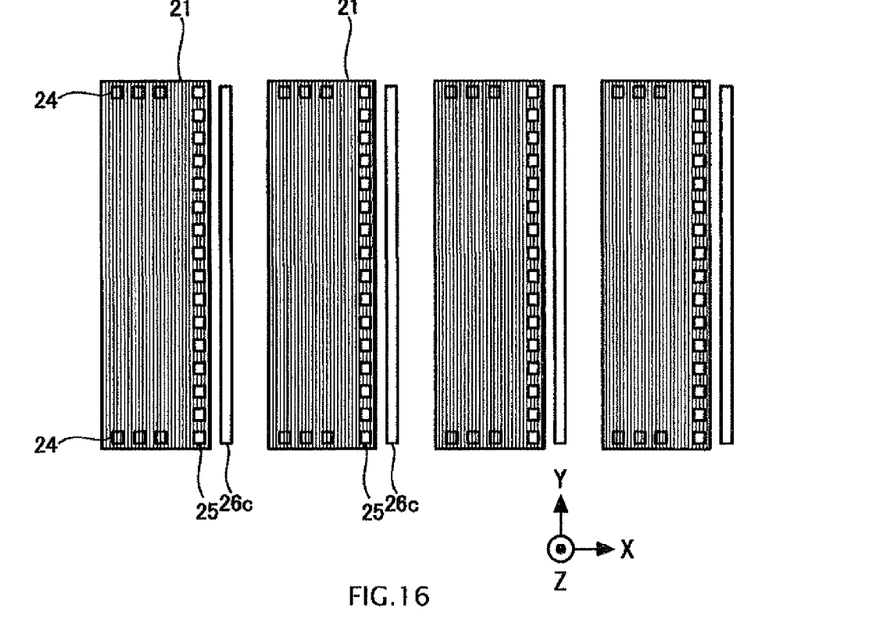
FIG. 16 is a schematic plan view showing an electrode layer including a polysilicon layer in FIG. 13 to FIG. 15.
Figure 17:
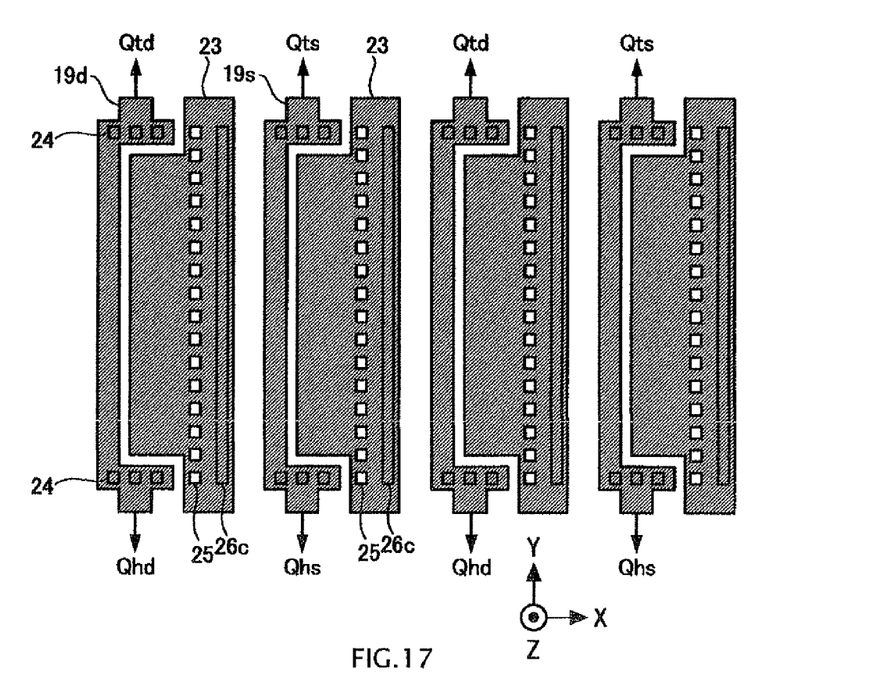
FIG. 17 is a schematic plan view showing an electrode layer and a wire layer including a first aluminum wire layer in FIG. 13 to FIG. 15.

FIG. 13 is a schematic plan view showing part of the structure of the storage capacitor group 4 of a solid state imaging device according to a second embodiment, corresponding to FIG. 3. FIG. 14 is a schematic section view along E-E' line in FIG. 13, corresponding to FIG. 4. FIG. 15 is a schematic section view along F-F' line in FIG. 13, corresponding to FIG. 5. FIG. 16 is a schematic plan view showing the electrode layer 21 including the polysilicon layer in FIG. 13 to 15, corresponding to FIG. 6. FIG. 17 is a schematic plan view showing the electrode layer 23 and the wire layers 19d and 19s including the first aluminum wire layer in FIG. 13 to FIG. 15, corresponding to FIG. 7. In FIG. 16 and FIG. 17, the contact holes 24 and 25 and a contact hole 26c are also shown.

The present embodiment differs from the first embodiment only in that the contact holes 26a and 26b are removed and instead of that, the upper side electrode layer 23 and the lower side electrode layer 28 are connected via one contact hole 26c (to be precise, aluminum that is the electric conductor formed in the contact hole 26c). The contact hole 26c is provided so as to extend continuously in the direction of the Y axis and occupy almost 100% of the opposed area between the electrode layers (signal electrode) 21 of the storage capacitors Ctd and Cts neighboring each other.

In the embodiment, in each of the section along E-E' line in FIG. 13 and the section along F-F' line in FIG. 13 also, as shown in FIG. 14 and FIG. 15, the contact hole 26c to which a fixed potential, such as the ground, is applied is interposed between the neighboring electrode layers (signal electrode) 21. Because of this, in each of the section along E-E' line in FIG. 13 and the section along F-F' line in FIG. 13, no coupling capacitance is formed between the neighboring electrode layers (signal electrode) 21 due to the electrostatic shielding effect of the contact hole 26c. Particularly, in the present embodiment, in each of the section along E-E' line in FIG. 13 and the section along F-F' line in FIG. 13, the electrode layer (signal electrode) 21 is completely shielded electrically by the electrode layers 23, 27 and 28 and the contact hole 26c constituting the fixed potential electrode, and therefore, no coupling capacitance is formed between the neighboring electrode layers (signal electrode) 21.

Consequently, in the present embodiment also, the coupling capacitance formed between the two storage capacitors Ctd and Cts neighboring each other is reduced and crosstalk between the neighboring pixel signals is reduced, and thereby, the noise in the image signal is reduced and the quality of the output image is improved.

Third Embodiment

Figure 18:
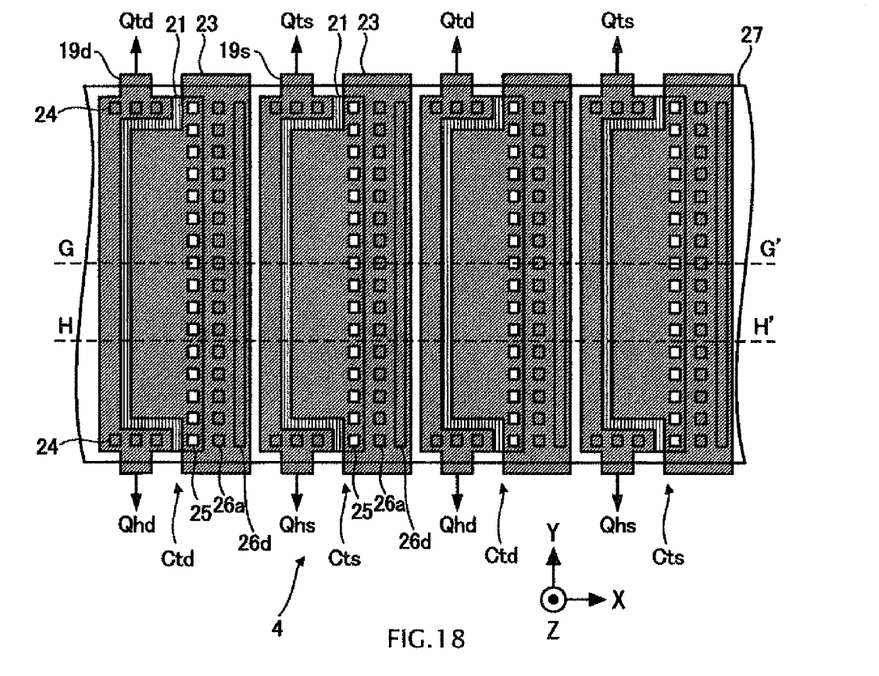
FIG. 18 is a schematic plan view showing part of a structure of a group of storage capacitors of a solid state imaging device according to a third embodiment.
Figure 19:
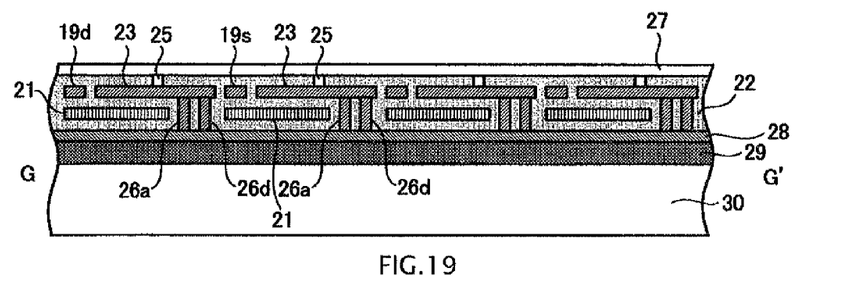
FIG. 19 is a schematic section view along G-G' line in FIG. 18.
Figure 20:
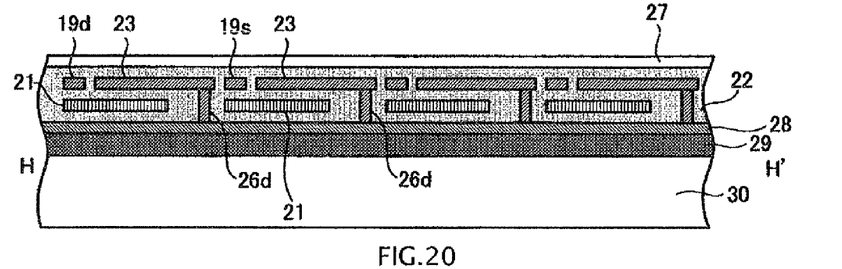
FIG. 20 is a schematic section view along H-H' line in FIG. 18.
Figure 21:
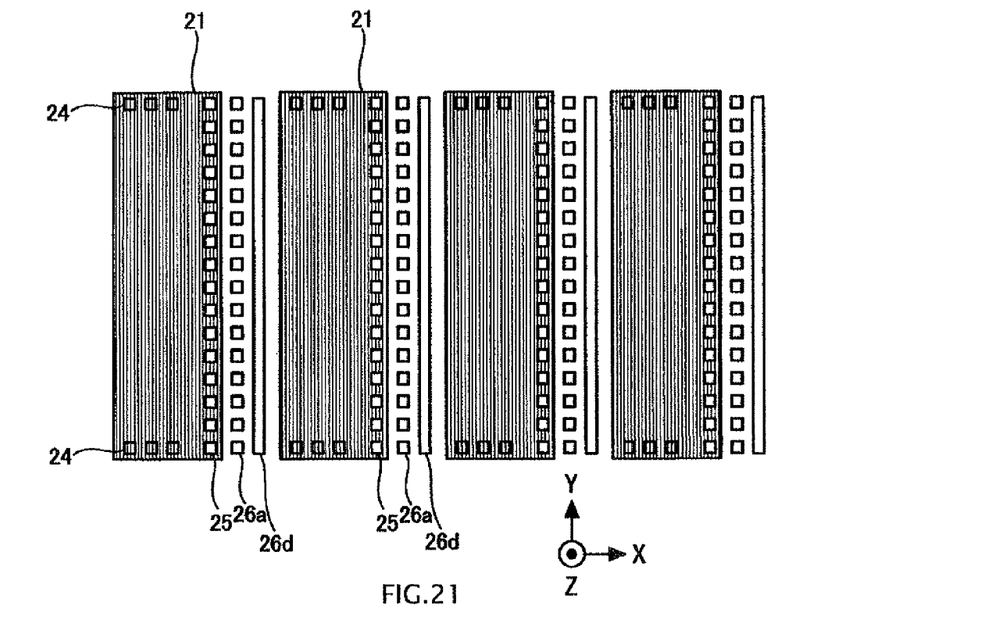
FIG. 21 is a schematic plan view showing an electrode layer including a polysilicon layer in FIG. 18 to FIG. 20.
Figure 22:
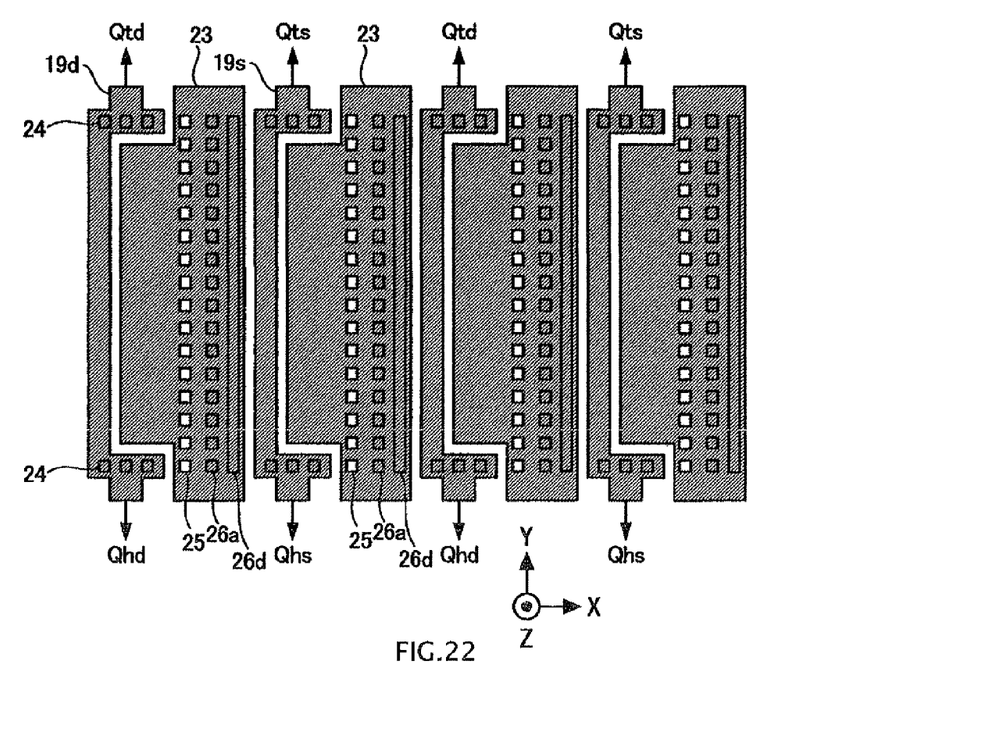
FIG. 22 is a schematic plan view showing an electrode layer and a wire layer including a first aluminum wire layer in FIG. 18 to FIG. 20.

FIG. 18 is a schematic plan view showing part of the structure of the storage capacitor group 4 of a solid state imaging device according to a third embodiment, corresponding to FIG. 3. FIG. 19 is a schematic section view along G-G' line in FIG. 18, corresponding to FIG. 4. FIG. 20 is a schematic section view along H-H' line in FIG. 18, corresponding to FIG. 5. FIG. 21 is a schematic plan view showing the electrode layer 21 including the polysilicon layer in FIG. 18 to FIG. 20, corresponding to FIG. 6. FIG. 22 is a schematic plan view showing the electrode layer 23 and the wire layers 19d and 19s including the first aluminum wire layer in FIG. 18 to FIG. 20, corresponding to FIG. 7. In FIG. 21 and FIG. 22, the contact holes 24, 25 and 26a and a contact hole 26d are also shown.

The present embodiment differs from the first embodiment only in that one contact hole 26d (to be precise, aluminum that is the electric conductor formed in the contact hole 26d) that connects the upper side electrode layer 23 and the lower side electrode layer 28 is provided instead of the contact hole 26b. The contact hole 26d is provided so as to extend continuously in the direction of the Y axis and occupy almost 100% of the opposed area between the electrode layers (signal electrode) 21 of the storage capacitors Ctd and Cts neighboring each other.

In the present embodiment, in the section along G-G' line in FIG. 18, as shown in FIG. 19, the contact holes 26a and 26d to which a fixed potential, such as the ground, is applied are interposed between the neighboring electrode layers (signal electrode) 21. Because of this, in the section along G-G' line in FIG. 18, no coupling capacitance is formed between the neighboring electrode layers (signal electrode) 21 due to the electrostatic shielding effect of the contact holes 26a and 26d. Particularly, in the present embodiment, in the section along G-G' line in FIG. 18, the electrode layer (signal electrode) 21 is completely shielded electrically by the electrode layers 23, 27 and 28 and the contact holes 26a and 26d constituting the fixed potential electrode, and therefore, no coupling capacitance is formed between the neighboring electrode layers (signal electrode) 21.

Further, in the present embodiment, in the section along H-H' line in FIG. 18, as shown in FIG. 20, the contact hole 26d to which a fixed potential, such as the ground, is applied is interposed between the neighboring electrode layers (signal electrode) 21. Because of this, in the section along H-H' line in FIG. 18, no coupling capacitance is formed between the neighboring electrode layers (signal electrode) 21 due to the electrostatic shielding effect of the contact hole 26d. Particularly, in the present embodiment, in the section along H-H' line in FIG. 18, the electrode layer (signal electrode) 21 is completely shielded electrically by the electrode layers 23, 27 and 28 and the contact holes 26d constituting the fixed potential electrode, and therefore, no coupling capacitance is formed between the neighboring electrode layers (signal electrode) 21.

Consequently, in the present embodiment also, the coupling capacitance formed between the two storage capacitors Ctd and Cts neighboring each other is reduced and crosstalk between the neighboring pixel signals is reduced, and thereby, the noise in the image signal is reduced and the quality of the output image is improved.

Each of the embodiments is explained as above, however, the present invention is not limited to these embodiments.

For example, in each of the embodiments described above, it may also be possible to provide an amplifier (a so-called column amplifier) to each vertical signal line 18 and to store a signal of the vertical signal line 18 in the storage capacitors Ctd and Cts after amplifying the signal by the column amplifier.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A solid state imaging device comprising:
   a plurality of pixels disposed two-dimensionally and photoelectrically converting an incident light;

vertical signal lines provided to correspond to each column of the plurality of pixels and to which output signals of the pixels of the column corresponding thereto are supplied; and a plurality of storage capacitors provided in a predetermined number to correspond to each of the vertical signal lines, in which a signal corresponding to a signal of the vertical signal line corresponding thereto is stored and at the same time, the signal being stored is supplied to a predetermined horizontal signal line, wherein:

the plurality of storage capacitors are provided sequentially side by side in a predetermined direction;

each of the storage capacitors has a first electrode section and a second electrode section that form a capacitance in between;

the first electrode sections of the plurality of storage capacitors are electrically connected with one another;

the second electrode sections of the plurality of storage capacitors are electrically independent of one another; and one or more electric conductors electrically connected to the first electrode section are provided between the second electrode sections of two neighboring storage capacitors of the plurality of storage capacitors so as to occupy 52% or more of an opposed area of the second electrode sections of two neighboring storage capacitors.

2. The solid state imaging device according to claim 1, wherein:

the one or more electric conductors include electric conductors in a plurality of groups;

the electric conductors in the plurality of groups are disposed in a column sequentially at intervals in a direction that intersects the predetermined direction for each group;

the columns including the electric conductors of each of the groups sequentially neighbor one another in the predetermined direction; and the position in the intersecting direction of each electric conductor of at least one group of electric conductors among the plurality of groups is shifted with respect to the position in the intersecting direction of each electric conductor of at least another group of electric conductors among the plurality of groups.

3. The solid state imaging device according to claim 1, wherein the one or more electric conductors include an electric conductor that continuously extends in a direction that intersects the predetermined direction.

4. The solid state imaging device according to claim 1, wherein:

the one or more electric conductors include a group of electric conductors disposed in a column sequentially at intervals in a direction that intersects the predetermined direction and an electric conductor that continuously extends in the intersecting direction; and the column of the one group of electric conductors and the electric conductor that continuously extends neighbor each other in the predetermined direction.

5. A solid state imaging device comprising:

a plurality of pixels disposed two-dimensionally and photoelectrically converting an incident light;

vertical signal lines provided to correspond to each column of the plurality of pixels and to which output signals of the pixels of the column corresponding thereto are supplied; and a plurality of storage capacitors provided in a predetermined number to correspond to each of the vertical signal lines, in which a signal corresponding to a signal of the vertical signal line corresponding thereto is stored and at the same time, the signal being stored is supplied to a predetermined horizontal signal line, wherein:

the plurality of storage capacitors are provided sequentially side by side in a predetermined direction;

each of the storage capacitors has a first electrode section and a second electrode section that form a capacitance in between;

the first electrode sections of the plurality of storage capacitors are electrically connected with one another;

the second electrode sections of the plurality of storage capacitors are electrically independent of one another;

one or more electric conductors electrically connected to the first electrode section are provided between the second electrode sections of two neighboring storage capacitors of the plurality of storage capacitors;

the one or more electric conductors include electric conductors in a plurality of groups;

the electric conductors in the plurality of groups are disposed in a column sequentially at intervals in a direction that intersects the predetermined direction for each group;

the columns including the electric conductors of each of the groups sequentially neighbor one other in the predetermined direction; and the position in the intersecting direction of each electric conductor of at least one group of electric conductors among the plurality of groups is shifted with respect to the position in the intersecting direction of each electric conductor of at least another group of electric conductors among the plurality of groups.

6. A solid state imaging device comprising:

a plurality of pixels disposed two-dimensionally and photoelectrically converting an incident light;

vertical signal lines provided to correspond to each column of the plurality of pixels and to which output signals of the pixels of the column corresponding thereto are supplied; and a plurality of storage capacitors provided in a predetermined number to correspond to each of the vertical signal lines, in which a signal corresponding to a signal of the vertical signal line corresponding thereto is stored and at the same time, the signal being stored is supplied to a predetermined horizontal signal line, wherein:

the plurality of storage capacitors are provided sequentially side by side in a predetermined direction;

each of the storage capacitors has a first electrode section and a second electrode section that form a capacitance in between;

the first electrode sections of the plurality of storage capacitors are electrically connected with one another;

the second electrode sections of the plurality of storage capacitors are electrically independent of one another;

one or more electric conductors electrically connected to the first electrode section are provided between the second electrode sections of two neighboring storage capacitors of the plurality of storage capacitors;

the one or more electric conductors include a group of electric conductors disposed in a column sequentially at intervals in a direction that intersects the predetermined direction and an electric conductor that continuously extends in the intersecting direction; and the column of the one group of electric conductors and the electric conductor that continuously extends neighbor each other in the predetermined direction.

7. The solid state imaging device according to claim 1, wherein
the plurality of storage capacitors includes a photo signal storage capacitor that stores a photo signal including photo information photoelectrically converted in the pixel and a differential signal storage capacitor that includes a noise component to be subtracted from the photo signal.

8. The solid state imaging device according to claim 5, wherein
the plurality of storage capacitors includes a photo signal storage capacitor that stores a photo signal including photo information photoelectrically converted in the pixel and a differential signal storage capacitor that includes a noise component to be subtracted from the photo signal.

9. The solid state imaging device according to claim 6, wherein
the plurality of storage capacitors includes a photo signal storage capacitor that stores a photo signal including photo information photoelectrically converted in the pixel and a differential signal storage capacitor that includes a noise component to be subtracted from the photo signal.

10. The solid state imaging device according to claim 1, wherein:
the first electrode section has an electrode layer;
the second electrode section has an upper side electrode layer and a lower side electrode layer disposed in a hierarchy on the upper side and the lower side with respect to the electrode layer of the first electrode section; and
the one or more electric conductors are formed in a contact hole to connect the upper side electrode layer and the lower side electrode layer.

11. The solid state imaging device according to claim 5, wherein:
the first electrode section has an electrode layer;
the second electrode section has an upper side electrode layer and a lower side electrode layer disposed in a hierarchy on the upper side and the lower side with respect to the electrode layer of the first electrode section; and
the one or more electric conductors are formed in a contact hole to connect the upper side electrode layer and the lower side electrode layer.

12. The solid state imaging device according to claim 6, wherein:
the first electrode section has an electrode layer;
the second electrode section has an upper side electrode layer and a lower side electrode layer disposed in a hierarchy on the upper side and the lower side with respect to the electrode layer of the first electrode section; and
the one or more electric conductors are formed in a contact hole to connect the upper side electrode layer and the lower side electrode layer.

* * * * *